United States Patent [19]

Gilboa

[11] Patent Number: 5,760,335
[45] Date of Patent: Jun. 2, 1998

[54] COMPENSATION OF ELECTROMAGNETIC DISTORTION CAUSED BY METAL MASS

[75] Inventor: Pinhas Gilboa, Haifa, Israel

[73] Assignee: Elbit Systems Ltd., Haifa, Israel

[21] Appl. No.: 284,701

[22] Filed: Aug. 1, 1994

[30] Foreign Application Priority Data

Aug. 2, 1993 [IL] Israel .................................. 106569

[51] Int. Cl.⁶ ................................................. H05K 9/00
[52] U.S. Cl. .................................... 174/35 R; 174/35 MS
[58] Field of Search ............................. 89/36.14, 36.02;
324/260, 261; 359/631, 635, 839, 858,
861; 174/35 R, 35 MS, 102 SP, 114 R;
361/816, 818, 800; 505/872; 307/91

[56] References Cited

U.S. PATENT DOCUMENTS

| | | |
|---|---|---|
| 3,541,473 | 11/1970 | Schlicke et al. ................ 333/12 |
| 3,923,370 | 12/1975 | Mostrom . |
| 4,054,881 | 10/1977 | Raab . |
| 4,287,809 | 9/1981 | Egli et al. . |
| 4,314,251 | 2/1982 | Raab . |
| 4,686,772 | 8/1987 | Sobel . |
| 4,761,056 | 8/1988 | Evans et al. . |
| 5,045,637 | 9/1991 | Sato et al. ................ 174/35 MS |
| 5,138,263 | 8/1992 | Towle ................ 324/338 |
| 5,220,957 | 6/1993 | Hance ................ 165/134.1 |

FOREIGN PATENT DOCUMENTS

| | | |
|---|---|---|
| 0058412 | 8/1982 | European Pat. Off. . |
| 0 242 484 | 10/1987 | European Pat. Off. . |
| 552515 | 4/1977 | U.S.S.R. . |

OTHER PUBLICATIONS

Application 08/077523 (Three dimensional tracking system employing a rotating field) which is US patent 5646524 has been considered, Jul. 1997.

*Primary Examiner*—Bot L. Ledynh
*Assistant Examiner*—Hung V. Ngo
*Attorney, Agent, or Firm*—Cushman Darby & Cushman IP Group of Pillsbury Madison & Sutro LLP

[57] ABSTRACT

A shield for electromagnetic radiation including a first layer having a high magnetic permeability and a second layer having a high electrical conductivity.

14 Claims, 3 Drawing Sheets

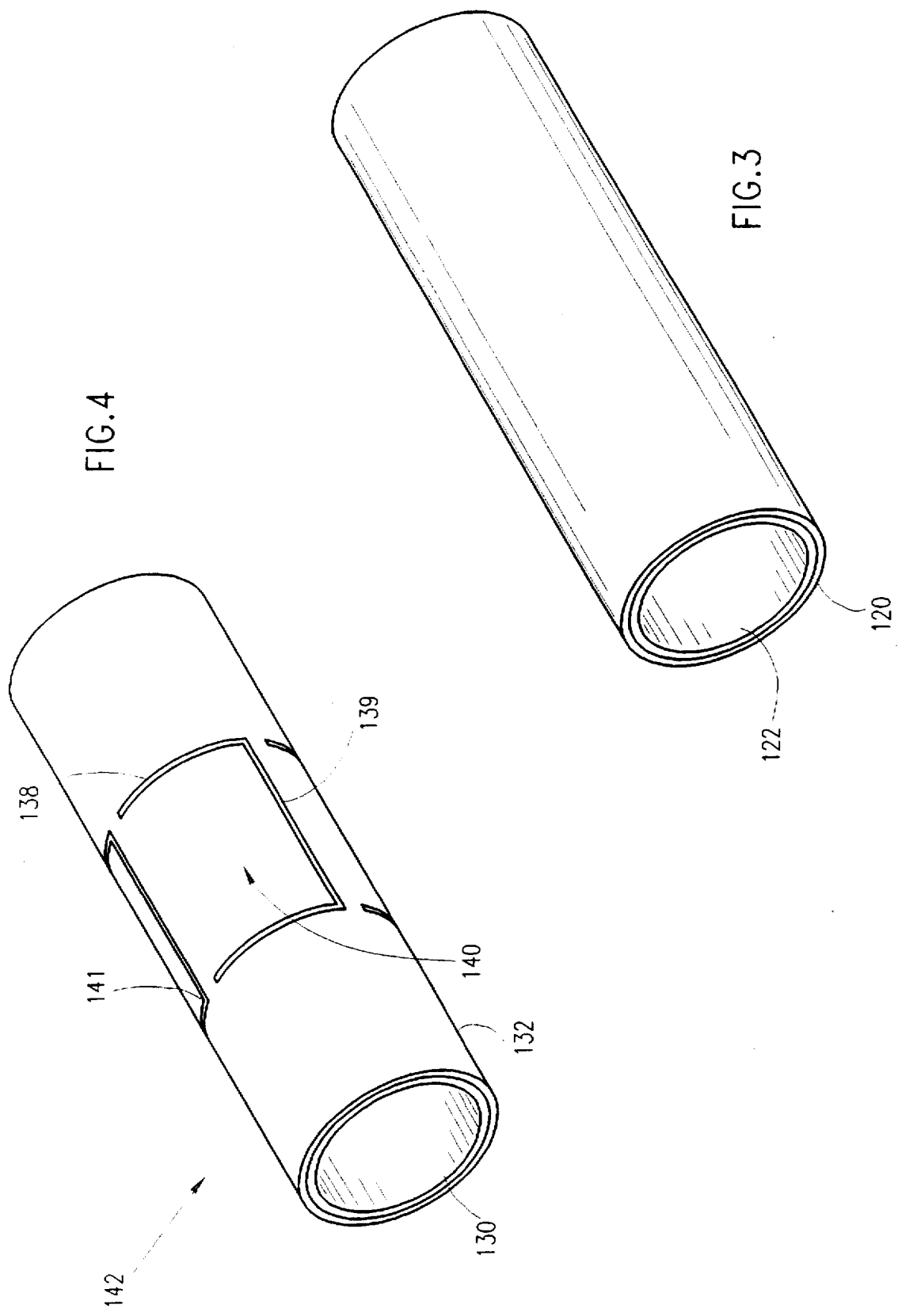

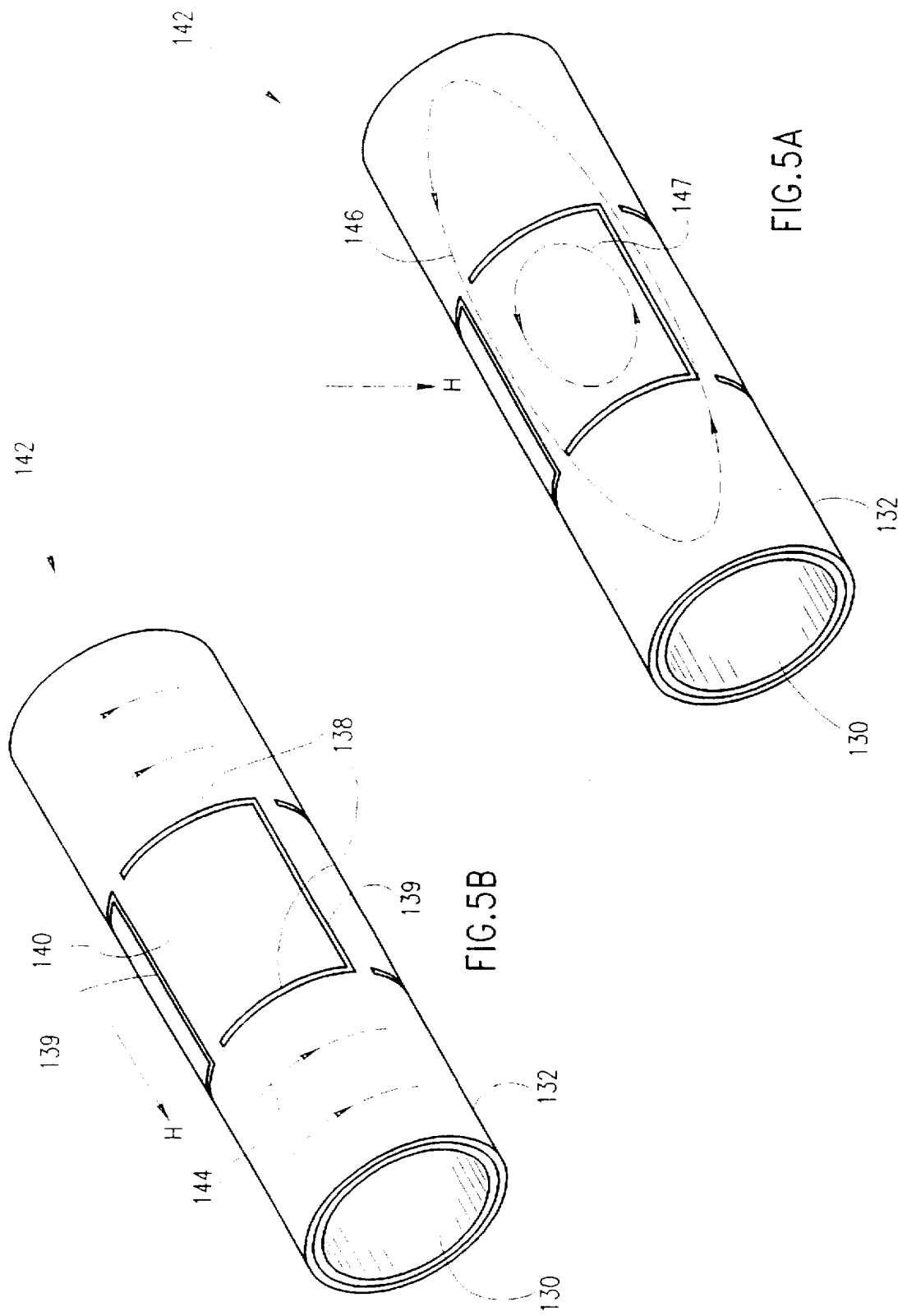

COMPENSATION OF ELECTROMAGNETIC DISTORTION CAUSED BY METAL MASS

FIELD OF THE INVENTION

The present invention relates to electromagnetic radiation shielding methods and apparatus.

BACKGROUND OF THE INVENTION

Electronic devices are often required to be shielded from electromagnetic (EM) fields. The metal mass used in shielding apparatus causes induced EM fields which can distort information bearing EM signals. One kind of instrument that uses EM fields is a helmet placement and orientation detector, where a sensor on a helmet is used to sense EM fields from a radiator, which determines position and orientation based on EM fields. When such fields are distorted, errors in the determination result.

Examples of such systems are described in U.S. Pat. No. 4,054,881, in U.S. Pat. No. 4,287,809, and in U.S. Pat. No. 4,314,251. The described systems measure the orientation of an aircraft pilots' helmet. Variations in the sensed fields allow the location and orientation of the sensor relative to the radiator can be calculated.

The described helmet orientation systems can also be coupled with a helmet mounted display, as described in U.S. Pat. No. 3,923,370 and in U.S. Pat. No. 4,761,056. The display image source, for example, a ½ inch diameter cathode ray tube (CRT) is shielded from EM radiation to prevent disturbance of the CRT by external EM fields, as well as to prevent disturbance of other systems in the aircraft by EM fields which are generated by the CRT coils. Since the CRT is relatively close to the position and orientation determining sensors, distortion of external EM fields caused by the shielding can result in errors in the determined orientation and position.

European Patent Application EP 0 058 412 A3 to Egli et. al. describes a method of compensating for the distorted field by iteratively calculating the distortions of the EM field vectors. This calculation pre-determines a matrix of constants which describe the relations between the undisturbed and the disturbed fields. However, due to the limited signal to noise ratio, this method has limited accuracy.

A better way of solving the problem of distortion caused by the shielding would be to avoid the distortion at its origin. Generally, either a permeable material such as mu-metal or a conductive metal is used for shielding. Mu-metal is generally the preferred metal because it will shield even when there are no EM field fluctuations. However, shields made of a highly permeable material such as mu-metal will cause external EM fields to be highly distorted. On the other hand, a shield constructed from a highly conductive material such as copper will result in distortion which is lower by approximately a factor of four, depending on the direction of the field, but shielding efficiency is also degraded by a factor of four.

At present, neither type of shielding offers a satisfactory solution of effective shielding action without undue distortion of external EM fields.

SUMMARY OF THE INVENTION

The purpose of the invention is to provide compensation for distortion of induced electromagnetic fields caused by the presence of a metal.

The purpose of the invention is to produce shielded elements, such as small CRT tubes, with minimum distortion of electromagnetic fields outside the shielding.

The present invention performs these purpose by providing a compensated shielding system which results in much lower field distortions.

Two kinds of material are useful for shielding. One is a highly permeable material such as mu-metal, and the other is a highly conductive material such as copper.

Under the effects of an external electromagnetic field, highly permeable material acts to bend magnetic field lines toward the material, as depicted for a cylindrical shell in FIG. 1. Under the effects of an external electromagnetic field, a conducting shell acts to bend magnetic field lines away from the shell, as depicted in FIG. 2.

In a preferred embodiment of the present invention two materials, which are complementary in nature, are combined to create a shield which will have a lower distortion of the external EM fields and, in some aspects of the invention, no substantial distortion of the external field.

In one aspect of the invention a combination of layers of permeable metal material and conductive metal material is used to produce an EM shield resulting in reduced field distortion.

In addition to lower induced field distortion, using a combination of highly permeable and conductive material in accordance with the invention results in an improvement in shielding efficiency. The provision of a thin layer of copper, a highly conductive material, outside a highly permeable mu-metal sleeve, still causes a distortion similar to that caused by conducting material, but the effect will be smaller than if highly permeable material is used alone. Moreover, the inventor has found that composite shielding in accordance with the invention is up to 10 times more efficient than using mu-metal alone.

The problem of shielding without causing induced external fields is a complicated one. Depending on the type of shielding material and on the direction of the magnetic and electric fields with respect to the surface of the shielding material, magnetic dipoles of varying directions and strengths are generated. Thus, while laminates of solid of mu-metal and copper greatly improve the shielding over that achieved by only one material, the dipoles which are generated by the layers still result in a net induced external field.

In a preferred embodiment of the present invention, at least one of the permeable and conductive layers is formed with voids so as to reduce the dipole fields which are generated by the layer. It has been found by the present inventor that constructions exist which result in excellent shielding, at a level higher than that of a single layer, but with little or no induced field.

It is an object of one aspect of the present invention to provide an EM shielding apparatus in the form of a sleeve. The sleeve is preferably built with an inner wall of highly permeable metal, preferably mu-metal coated with a foil of highly conductive metal, preferably copper. Furthermore, in a preferred embodiment of the invention, the sleeve is constructed in a manner designed to limit any current loops caused by the shape of the sleeve when in the presence of external EM fields. Alternatively, the copper foil can be the internal layer and the mu-metal the external layer.

The present inventor has discovered that when an external magnetic field is applied transverse to a mu-metal sleeve having a length of 70 mm and a diameter of 20 mm, substantially zero field distortion is achieved when the sleeve is covered over its entire length with highly conductive metal, except for a slit or slits running along the circumference of the sleeve and having a total width of approximately 2 mm (2.9 percent of the length).

However, such sleeves do not result in such low distortion for axial magnetic fields. The present inventor has also discovered that for an external magnetic field applied along the axis of a straight sleeve, substantially zero field distortion is achieved when a mu-metal sleeve is covered with a highly conductive metal, except for a central region approximately 24 mm long (approximately 34 percent of the length of the sleeve). However, such sleeves do not result in such low distortion for transverse applied fields.

In a preferred embodiment of the present invention, external field distortion from a shielding sleeve is reduced by using a sleeve of mu-metal covered with a highly conductive layer of material. Preferably, the conductive layer is slotted with a plurality of "U"-shaped slots which consist of a lengthwise slit in the metal having a length of, preferably, approximately 24 mm and two circumferential slits in the conductive metal starting at the ends of the length-wise break, each of which almost reaches the next "U"-shaped slot. The width of the slots is preferably 0.6 mm which is approximately 0.86% of the length of the sleeve.

Preferably, the slots are arranged to allow for electrical continuity along the length of the sleeve between the ends of the circumferential slit and the next "U"-shaped slot, to let two current loops develop over the entire length of the sleeve as depicted in FIG. 5, while suppressing circumferential loops in the center portion of the sleeve. Preferably 4 slots are used.

In a preferred embodiment of the invention, the layers are configured to give minimum distortion at a desired frequency.

The present inventor has measured the effects of EM shielding apparatus as described above, and has found practically no EM field distortion at least for the frequency of interest, except very near the shield. Thus, EM shielding constructed according to the preferred embodiment of the present invention can safely be used next to instruments relying on EM field sensors.

Alternatively, the interior layer may be a highly conducting material and the external material a highly permeable material. In this case the optimum configuration is believed to be a solid copper sleeve covered with patches of mu-metal.

For non-cylindrical surfaces, or for cylindrical surfaces of different dimensions or for different design frequencies, the optimal configuration may have to be determined by simple experimentation, using the principle of cancellation of the dipole moments generated by the conducting and permeable material.

In a further preferred embodiment of the invention, the conducting layer may be very thin (on the order of a skin depth at the frequency of radiation) or may have a reduced conductivity in order to control the magnitude of the dipole induced in the conductor.

BRIEF DESCRIPTION OF THE DRAWINGS

The present invention will be understood and appreciated more fully from the following detailed description, taken in conjunction w the following drawings in which:

FIG. 3 is an illustration of a sleeve constructed from complementary metals, in accordance with one aspect of the present invention;

FIG. 4 is a perspective view of an EM shielding sleeve constructed and operative in accordance with a preferred embodiment of the present invention; and FIG. 5 is an illustration depicting internal current flow in the EM shielding sleeve of FIG. 4 in the presence of an external magnetic field.

DETAILED DESCRIPTION OF THE PREFERRED EMBODIMENTS

There are two kinds of materials which are useful for creating shields. One is a highly permeable material such as mu-metal, and the other is a highly conductive material such as copper.

Figure 1:
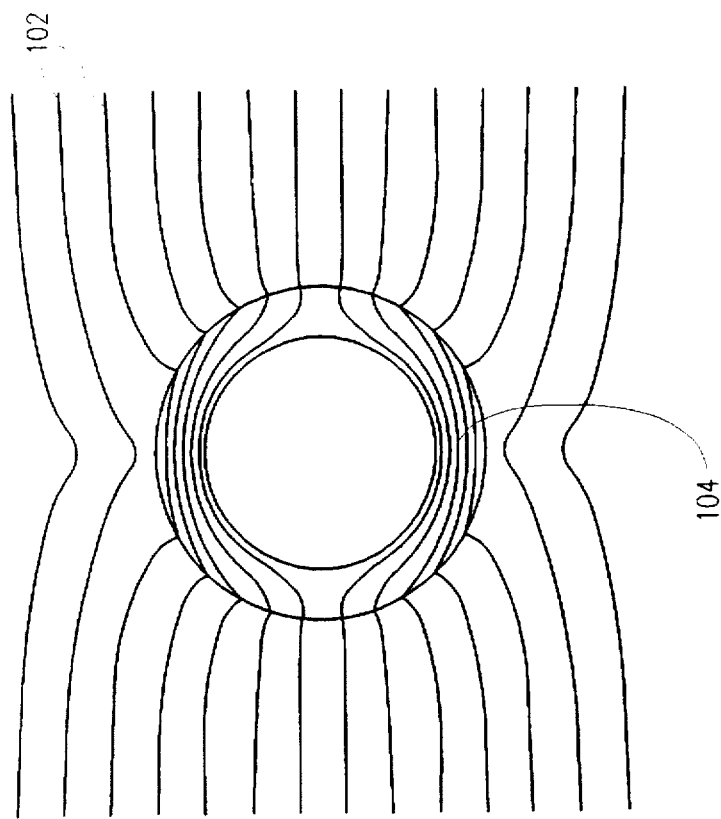
FIG. 1 is an illustration depicting the effect of a highly permeable EM shield on an external magnetic field.

Referring to FIG. 1, under the effects of an external electromagnetic field, a highly permeable shell 104 acts as a magnetic dipole, having a dipole vector parallel to the induced field, so the effect is that field lines 102 are bent toward shell 104, as shown in FIG. 1.

Figure 2:
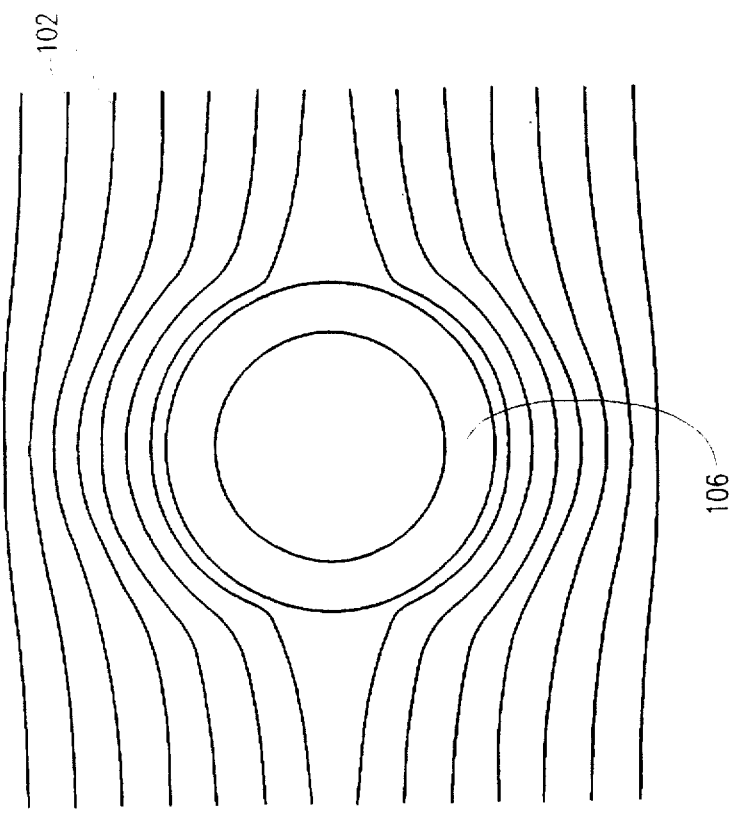
FIG. 2 is an illustration depicting the effect of a highly conductive EM shield on an external magnetic field.

Referring to FIG. 2, under the effects of an external electromagnetic field, a conducting shell 106 acts as a magnetic dipole, having a dipole vector anti-parallel to the external field, so that field lines 102 are bent away from shell 106, as depicted in FIG. 2. This is a result of eddy currents which arise from the varying EM fields. The relative magnitude of the current is proportional to the frequency of field fluctuations and the conductivity of the material.

The invention is based on the complementary nature of the magnetic dipoles induced in conducting and permeable layers by external magnetic fields.

For a thin, flat, highly conducting layer, a magnetic dipole is induced when the magnetic field is perpendicular to the layer. This is caused by induced currents in the conducting layer. A magnetic field which is parallel to the layer will induce essentially no dipole. A magnetic dipole will also be induced when a ring of conductor is placed with its axis parallel to the external magnetic field, since in this case also currents are induced by the magnetic field.

For a thin, flat, layer of highly permeable material, parallel magnetic fields induce magnetic dipoles. A magnetic field perpendicular to a highly permeable layer will induce almost no dipole.

By carefully choosing the conductivity and permeability and the shape and orientation of layers of conducting and permeable materials, good compensation can be achieved such that, at least over a range of frequencies, external induced magnetic fields are reduced or canceled.

For example, if compensation for the induced dipoles for a flat conducting sheet is desired, then a pattern of permeable strips placed perpendicular to the surface of the sheet can reduce the field distortion caused by the sheet. The number and size of the strips is varied to optimize the compensation.

In shielding situations, where the shield is generally closed or nearly closed, for any aspect of the magnetic field some surfaces of the shield are perpendicular to the magnetic field and some are parallel. In such cases, composite material formed of a layer of conducting and a layer permeable material may be used effectively, preferably, by applying only partial coverage of one layer or by forming slots or other apertures in one of the layers.

This general principle can also be applied to cylindrical shields which are open at the ends since magnetic dipoles are induced in both conducting permeable sleeves for all directions of magnetic field.

Thus in a preferred embodiment of the present invention, a combination of layers of permeable material and conductive material is used to produce an EM shield resulting in reduced field line distortion.

One embodiment of the invention, namely a cylindrical shield, for example for a one-half inch diameter CRT, is shown in FIG. 3. In this shield, a thin layer of copper 120, a highly conductive material, is applied outside a highly permeable mu-metal sleeve 122. While this results in better shielding (by a factor of 10) than with mu-metal alone, a distortion of the fields still occurs (similar to that of copper alone). However, the distortion is smaller than when using highly permeable material alone.

The present inventor has discovered that for an external magnetic field, having a frequency of 12 KHz, applied along the axis of a straight sleeve, having a diameter of 20 mm and a length of 70 mm, substantially zero field distortion is achieved when a mu-metal sleeve is covered with highly conductive metal except over approximately 24 mm of its length (i.e., approximately 34% of the length). It is to be appreciated that an other percentage of uncovered sleeve length may be adequate to provide substantially zero field distortion.

The present inventor has also discovered that for an external magnetic field exerted perpendicular to the axis of a straight sleeve, substantially zero field distortion is achieved when a mu-metal sleeve is covered by 100 percent of its length with highly conductive metal, except for a slit or slits running along the circumference of the sleeve, and having a total width of approximately 2 mm (2.9 percent of the sleeves' length). It is to be appreciated that other mathematical relations between the total width of the slits and the sleeves' length or sleeves' circumference may be also adequate to provide substantially zero field distortion.

Referring to FIG. 4, a preferred embodiment of the present invention is shown which allows for the construction of EM shielding apparatus in the shape of a sleeve 142, which results in improved shielding and in very low field distortions. Sleeve 142 comprises an inner wall 130 of highly permeable metal such as mu-metal, coated with a highly conductive metal layer 132 such as copper foil.

In a preferred embodiment of the invention, conductive layer 132 is slotted in the middle of sleeve 142 with a plurality of "U"-shaped slots 140, each "U"-shaped slot 140 consisting of a lengthwise slit 139 in conductive metal layer 132 having a length of approximately 34 percent of the sleeves' length and circumferential slits 138 in conductive layer 132 which almost reach a next "U"-shaped slot 141. The preferred width of slits 138 and 139 in which four "U"-shaped slots 140 are used, is approximately 0.6 mm.

These dimensions are optimized for minimum induced fields over a frequency range centered about 12 kHz. This frequency is chosen since most position detecting sensors used on pilot helmets operate at frequencies near this frequency. For other frequencies other dimensions will be found to give optimum results.

Referring additionally to FIGS. 5A and 5B, induced current flows are depicted in EM shielding sleeve 142 in the presence of an external electromagnetic field having its magnetic field perpendicular to the axis of the sleeve. "U"-shaped slots 140 are arranged to allow for electrical continuation along the length of sleeve 142 between the ends of circumferential slit 138 and a next "U"-shaped slot 141, to let current loops 146 and 147, develop over the length of sleeve 142 as depicted in FIG. 5A. FIG. 5B shows the effect of an axial magnetic field. In the end portions circumferential current 144 can form. However, in the central portion such loops are suppressed by slots 140.

In a preferred embodiment of the present invention, when the object to be shielded has a diameter of one-half inch, conductive material 132 is preferably a copper foil having a thickness of at least 25 micrometers, and the thickness of inner mu-metal wall 130 is at least 100 micrometers. The choice of wall thicknesses, slot lengths and widths may vary and other configurations can also give the desired results of the invention.

The inventor has measured the effects of EM shielding apparatus as described above, and has found practically no EM field distortion at all at least at the frequency of interest, except very near the shield. Thus, EM shielding constructed according to a preferred embodiment of the present invention can safely be used next to instruments relying on EM field sensors.

For flat surfaces it is believed that a composite material such as a solid sheet of mu-metal combined with a rectangular or other matrix of copper strips perpendicular to the mu-metal surface or a solid sheet of copper combined with a matrix of mu-metal strips can be used to effectively reduce the induced field.

It will be appreciated by persons skilled in the art that the present invention is not limited by what has been particularly shown and described herein. Rather, the scope of the present invention is defined only by the claims which follow:

I claim:

1. A shield for electromagnetic radiation comprising:

a first layer having a high magnetic permeability; and a second layer having a high electrical conductivity, at least one of said first and second layers having a plurality of apertures formed therein, said apertures being operative to reduce the effect of the shield on the electromagnetic field outside the shield, wherein said plurality of apertures comprise a plurality of generally "U"-shaped slots, wherein said shield has a generally cylindrical shape of a given length, wherein said first layer comprises an inner portion, and said second layer comprises an outer portion of said generally cylindrical shape, wherein each of said "U"-shaped slots comprises a lengthwise slit and two circumferential slits in said second layer, wherein said circumferential slits are generally perpendicular to said lengthwise slit and communicate with the ends of said lengthwise slit, and wherein said two circumferential slits are separated from a nearby lengthwise slit of an adjacent "U"-shaped slot by a solid conducting material surface.

2. A shield according to claim 1 wherein the accumulated width of said lengthwise slits is equal to approximately 2.9 percent of the cylinder length.

3. A shield according to claim 1 and wherein said lengthwise slit has a length of approximately 34 percent of said given length of said generally cylindrical shape.

4. A shield according to claim 1 and comprising a plurality of said "U"-shaped slots, uniformly distributed at the central part of the circumferential surface of said generally cylindrical shape.

5. A shield according to claim 2 and comprising a plurality of said "U"-shaped slots, uniformly distributed at the central part of the circumferential surface of said generally cylindrical shape.

6. A shield according to claim 1 and wherein said solid conducting material surface separating said two circumferential slits from a nearby said lengthwise slit is substantially smaller than the length of each of said circumferential slits.

7. A shield according to claim 2 and wherein said solid conducting material surface separating said two circumferential slits from a nearby said lengthwise slit is substantially smaller than the length of each of said circumferential slits.

8. A shield according to claim 4 and wherein said solid conducting material surface separating said two circumferential slits from a nearby said lengthwise slit is substantially smaller than the length of each of said circumferential slits.

9. A shield according to claim 5 and wherein said solid conducting material surface separating said two circumferential slits from a nearby said lengthwise slit is substantially smaller than the length of each of said circumferential slits.

10. A shield according to claim 1 and wherein at least one of dimensions of said "U"-shaped slots and thicknesses of said first and second layers are selected to reduce the electromagnetic field distortion over selected groups of frequencies.

11. A shield according to claim 2 and wherein at least one of dimensions of said "U"-shaped slots and thicknesses of said first and second layers are selected to reduce the electromagnetic field distortion over selected groups of frequencies.

12. A shield according to claim 1 wherein the first and second layers are configured to produce fields having substantially opposite dipole moments in the presence of an external electromagnetic field.

13. A shield according to claim 11 wherein the at least one of dimensions and thickness are selected by experimentation.

14. A shield according to claim 10 wherein the at least one of dimensions and thickness are selected by experimentation.

* * * * *